(12) United States Patent
Liao

(10) Patent No.: US 6,391,739 B1
(45) Date of Patent: May 21, 2002

(54) PROCESS OF ELIMINATING A SHALLOW TRENCH ISOLATION DIVOT

(75) Inventor: Kent Liao, Pin Dong Hsien (TW)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/619,023

(22) Filed: Jul. 19, 2000

(51) Int. Cl.⁷ .............................................. H01L 21/76
(52) U.S. Cl. ........................ 438/424; 438/221; 438/296; 438/426; 438/431; 257/506; 257/510
(58) Field of Search ................................. 438/424, 426, 438/431, 296, 221; 257/506, 510

(56) References Cited

U.S. PATENT DOCUMENTS 5,393,694 A * 2/1995 Mathews ..................... 438/448
6,130,467 A * 10/2000 Bandyopadhyay .......... 257/506

* cited by examiner

Primary Examiner—Wael Fahmy
Assistant Examiner—Hsien-Ming Lee

(74) Attorney, Agent, or Firm—Chien-Wei (Chris) Chou; Oppenheimer Wolff & Donnelly LLP

(57) ABSTRACT

A process of fabricating a shallow trench isolation structure includes the steps of: providing a substrate; forming a first insulating layer over the substrate; forming a nitride masking layer over the first insulating layer; patterning and etching the nitride masking layer, the first insulating layer and the substrate to remove portions of the nitride masking layer, the first insulating layer and the substrate thereby forming an exposed trench in the substrate, the trench substantially defining boundaries of the isolation structure; depositing a second insulating layer into the trench and over the nitride masking layer; planarizing the second insulating layer to expose the nitride masking layer; removing the nitride masking layer to expose the first insulating layer, and forming a divot proximate an edge of the trench; depositing a silicon layer into the divot, and over the first insulating later and the second insulating layer; etching the silicon layer to expose the first insulating layer, a central portion of the second insulating layer, and leaving a remaining portion of the silicon layer filling the divot; and oxidizing the remaining portion of the silicon layer.

20 Claims, 5 Drawing Sheets

PROCESS OF ELIMINATING A SHALLOW TRENCH ISOLATION DIVOT

BACKGROUND OF THE INVENTION

1. Field of the Invention

The present invention relates generally to a process of forming an isolation region in a semiconductor device, and more specifically to a process of fabricating a shallow trench isolation (STI) structure in a semiconductor device.

2. Description of the Prior Art

As semiconductor device dimensions decrease, and device density increases, it becomes more difficult to efficiently and reliably fabricate isolation structures for separating active areas of the device. One common method of forming isolation structures for semiconductor devices is referred to as localized oxidation of silicon (LOCOS). However, the limits of the standard LOCOS process have motivated the development of new isolation processes. A trench isolation process is now widely used as it uses a fully recessed oxide, has no bird's beaks, is fully planar, and does not suffer from field oxide thinning effects. However, trench isolation structures formed in accordance with conventional trench isolation processes still suffer from problems such as the well known "corners" effect problem which arises due to a divot being formed proximate the edge of the trench. This divot can increase device leakage current, especially when the trench is recessed, thereby causing the life of the semiconductor device to be shortened.

Figure 1:
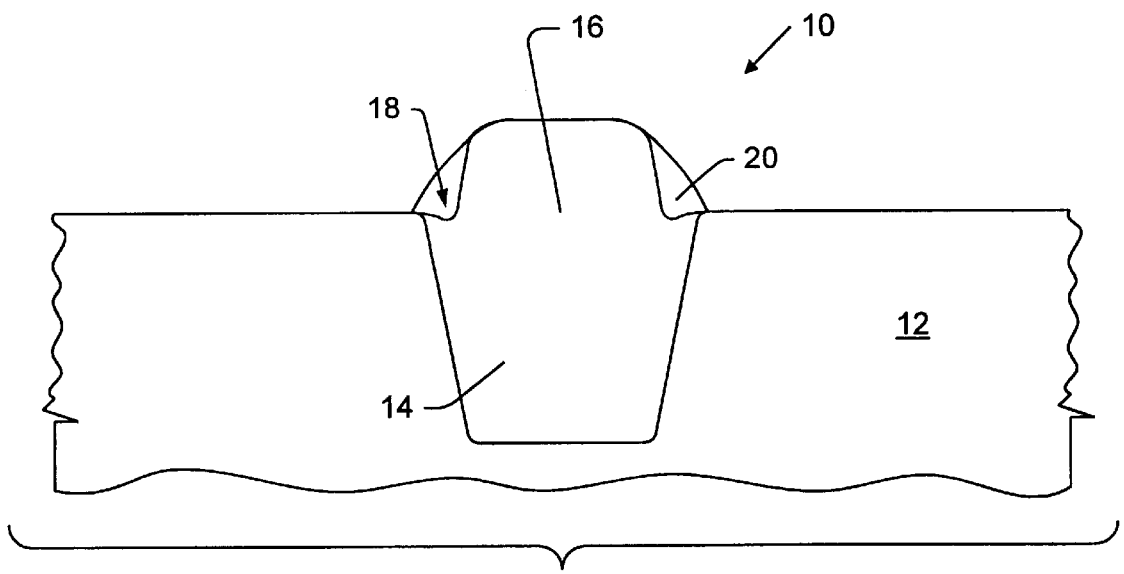

FIG. 1 shows a cross-sectional view of a typical prior art shallow trench isolation (STI) structure at 10. The STI structure 10 is formed within and over a substrate 12. In accordance with conventional processes of manufacturing an STI structure, a trench 14 is formed within the substrate 12, and isolation material 16 commonly referred to as trench oxide material is deposited within the trench 14. As mentioned above, a problem that arises in conventional shallow trench isolation processes is that a recess, or divot 18 is formed proximate the edge of the trench 14. When the isolation material 16 is etched, the divot 18 results wherein little or no isolating material 16 remains at the "corners" of the trench 14. The exposed "corners" are potential points of current leakage between active areas of the semiconductor device. In accordance with one conventional STI process, silicon oxide material 20 is formed within the divot 18 proximate the edge of the trench 14. A layer (not shown) of silicon oxide is formed over the isolation material and over an exposed portion of the substrate, and the layer of silicon oxide is subsequently etched to leaving the silicon oxide material 20 within the divot 18. However, a problem arises in that damage is caused to the substrate 12 during this step of etching to remove the silicon oxide layer (not shown) because no etch stop layer is used in this process.

Figure 2:
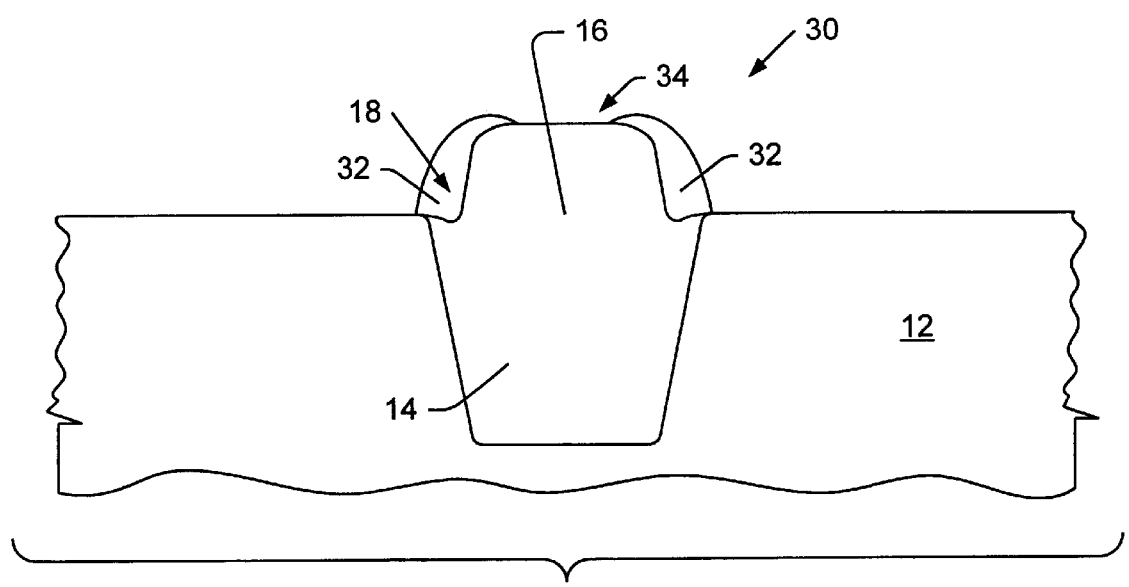

FIG. 2 shows a cross-sectional view of a second prior art STI structure at 30 wherein the trench 18 is filled with silicon nitride material 32. In accordance with a conventional process for forming the STI structure 30, a pad oxide (not shown) is used as an etch stop layer. A subsequent process must be performed in order to remove the pad oxide resulting in a portion 34 of the trench oxide 16 being removed. Therefore, the top surface of the STI structure 10 is not planar because a silicon nitride bump is created. This increases leakage current between active areas of the device leading to device degradation.

SUMMARY OF THE INVENTION

It is an object of the present invention to provide a process of fabricating a shallow trench isolation (STI) structure that provides for improved isolation between active areas of a semiconductor device, and which does not result in the substrate of the device being damaged.

Briefly, a presently preferred embodiment of the present invention includes a process of fabricating a shallow trench isolation structure including the steps of: providing a substrate; forming a first insulating layer over the substrate; forming a nitride masking layer over the first insulating layer; patterning and etching the nitride masking layer, the first insulating layer and the substrate to remove portions of the nitride masking layer, the first insulating layer and the substrate thereby forming an exposed trench in the substrate, the trench substantially defining boundaries of the isolation structure; depositing a second insulating layer into the trench and over the nitride masking layer; planarizing the second insulating layer to expose the nitride masking layer; removing the nitride masking layer to expose the first insulating layer, and forming a divot proximate an edge of the trench; depositing a silicon layer into the divot, and over the first insulating later and the second insulating layer; etching the silicon layer to expose the first insulating layer, a central portion of the second insulating layer, and leaving a remaining portion of the silicon layer filling the divot; and oxidizing the remaining portion of the silicon layer.

An important advantage of the process of fabricating an STI structure in accordance with the present invention is that it provides for improved isolation between active areas of a semiconductor device by eliminating the divot.

Another important advantage of the process of the present invention is that the substrate is protected by the first insulating layer which provides an etch stop layer during the step of etching the silicon layer. Therefore, the substrate is not damaged as a result of forming the STI structure.

The foregoing and other objects, features, and advantages of the present invention will be apparent from the following detailed description of the preferred embodiment which makes reference to the several figures of the drawing.

IN THE DRAWING

FIGS. 1 and 2 are cross-sectional views of shallow trench isolation (STI) structures manufactured in accordance with two different conventional processes of manufacturing an STI structure;

FIGS. 3A through 3F are cross-sectional views illustrating a progression of manufacturing steps in accordance with a first embodiment of a process of manufacturing an STI structure in accordance with the present invention; and FIGS. 3A through 3D and FIGS. 3G through 3J are cross-sectional views illustrating a progression of manufacturing steps in accordance with a second embodiment of a process of manufacturing an STI structure in accordance with the present invention.

DETAILED DESCRIPTION OF THE PREFERRED EMBODIMENTS

FIGS. 3A through 3J are cross-sectional views illustrating a progression of manufacturing steps in accordance with a process of manufacturing an STI structure in accordance with the present invention.

Figure 3A:
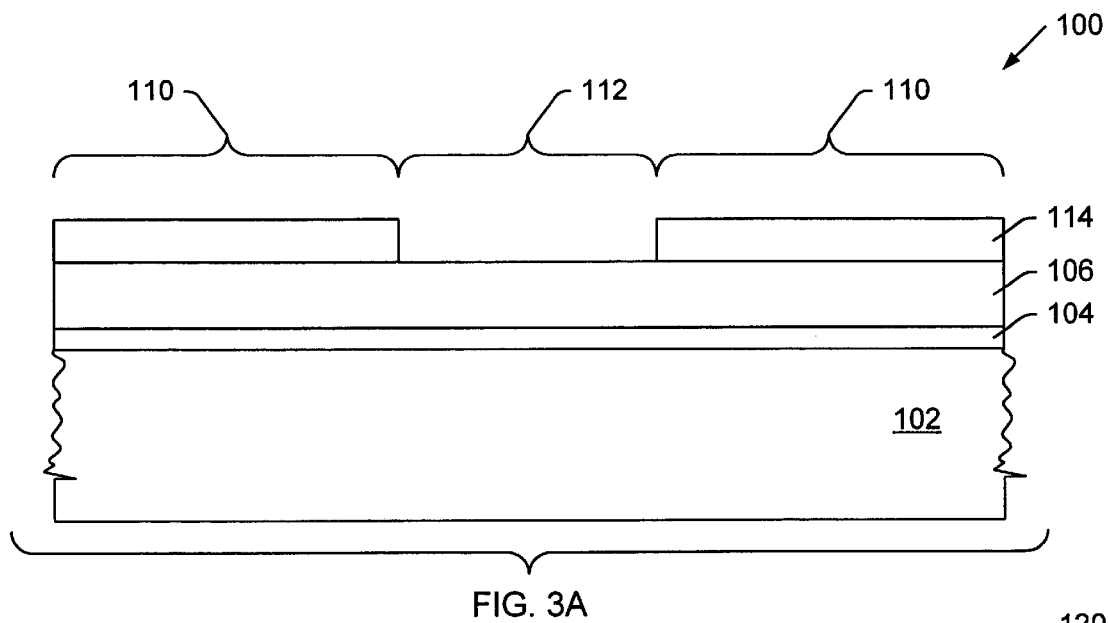

FIG. 3A shows a cross-sectional view of a semiconductor structure at 100 formed in accordance with preliminary steps of the process of the present invention. A semiconductor substrate 102 is provided, and a first insulating layer 104 is formed over the semiconductor substrate. In one embodiment, the first insulating layer 104 is formed by performing an oxidation process to form a pad oxide. However, any other suitable insulating material may also be used. As further explained below, the first insulating layer 104 is used as an etching stop layer for preventing damage to the substrate 102 during subsequent etching steps.

A silicon nitride masking layer 106 is deposited over the first insulating layer 102. The step of depositing the silicon nitride masking layer 106 is preferably performed in accordance with a chemical vapor deposition (CVD) process. The CVD process may include low pressure chemical vapor deposition (LPCVD), plasma enhanced chemical vapor deposition (PECVD), or high density plasma CVD. In one embodiment, the masking layer 106 is formed from silicon nitride. In another embodiment, the masking layer 106 is formed using conductive materials such as polysilicon and polysilicon/nitride. Initial steps in defining active areas 110 and trench areas 112 of the semiconductor substrate 102 include applying a photo-resistive mask 114 over the nitride masking layer 106.

Figure 3B:
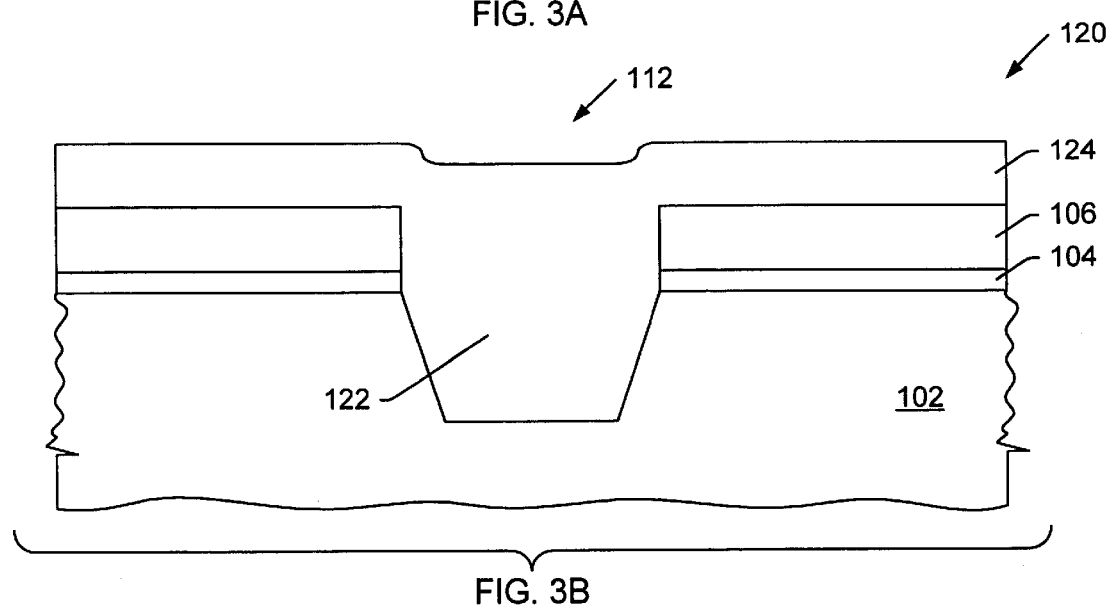

FIG. 3B shows a cross-sectional view of a semiconductor structure at 120 that results from performance of additional steps of the process of the present invention on the structure 100 (FIG. 3A). A photolithographic step is performed to remove portions of the nitride masking layer 106 and insulating layer 104 in the trench area 112, thereby exposing a portion of the substrate 102. After removing portions of the masking layer 106 and insulation layer 104 in the trench area 112, the photo-resistive mask 114 (FIG. 3A) is removed. Further etching is performed in order to remove a portion of the substrate 102 in the trench area 112 thereby forming a trench 122. Subsequently, a second insulating layer 124 is formed over the nitride masking layer 106, and over the trench area 112 to fill the trench 122. In an embodiment, the second insulating layer 124 is formed using silicon dioxide.

Figure 3C:
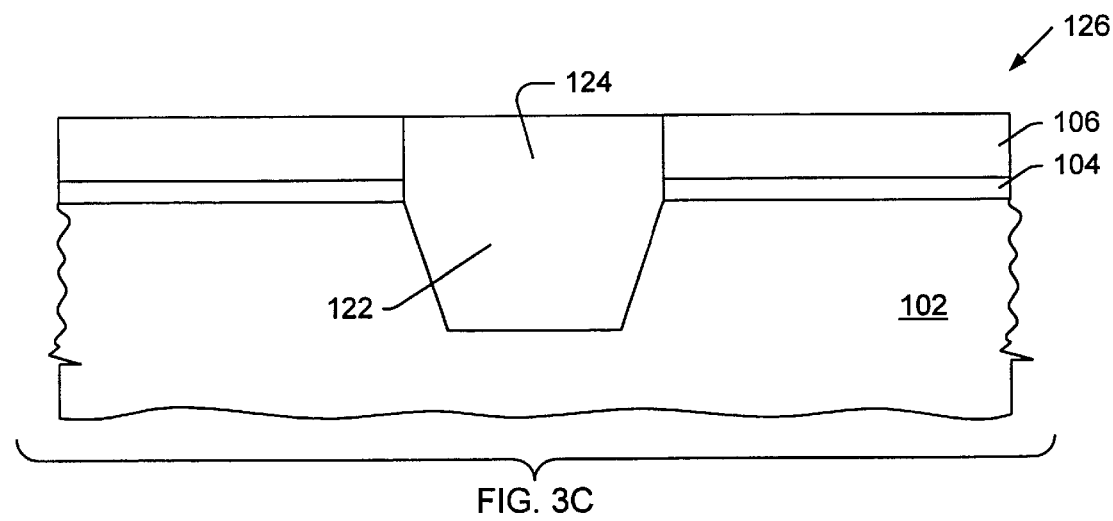

FIG. 3C shows a cross-sectional view of a semiconductor structure at 126 that results from performance of a planarization step on the structure 120 (FIG. 3B). A planarization step is performed to remove a portion of the second insulating layer 124, exposing the nitride masking layer 106. The planarization step may be accomplished using any of a variety of suitable methods, such as chemical-mechanical polishing (CMP), dry etching, or a combination thereof.

Figure 3D:
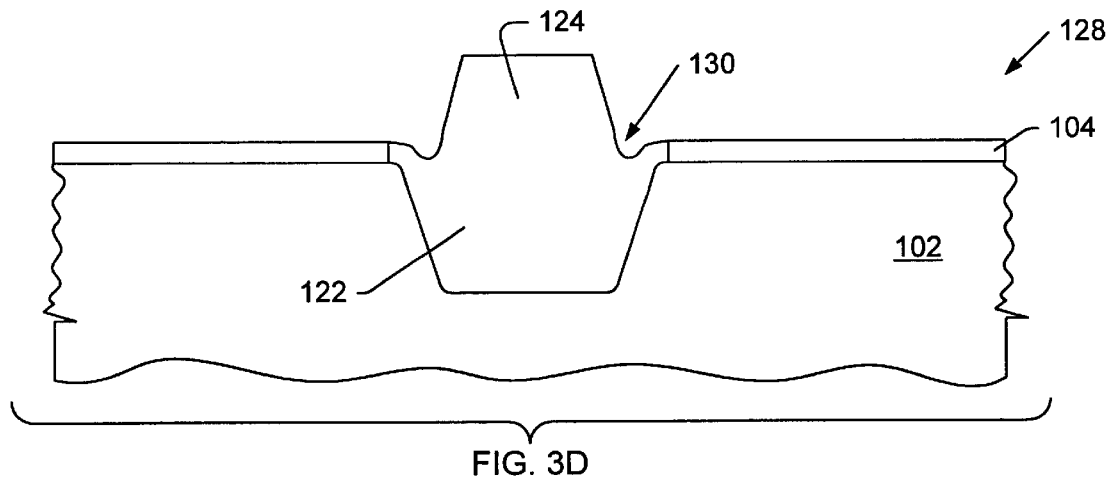

FIG. 3D shows a cross-sectional view of a semiconductor structure at 128 that results from performance of a step of removing the silicon nitride masking layer 106 (FIG. 3C) from the structure 126 (FIG. 3C) to expose the insulating layer 104. Note that a divot 130 is formed proximate the edge of the trench 122 during the step of removing the nitride masking layer 106. The divot results where little or no insulating material isolating material remains at the corners of the trench. The exposed corners are potential points of current leakage between regions of the active areas.

Figure 3E:
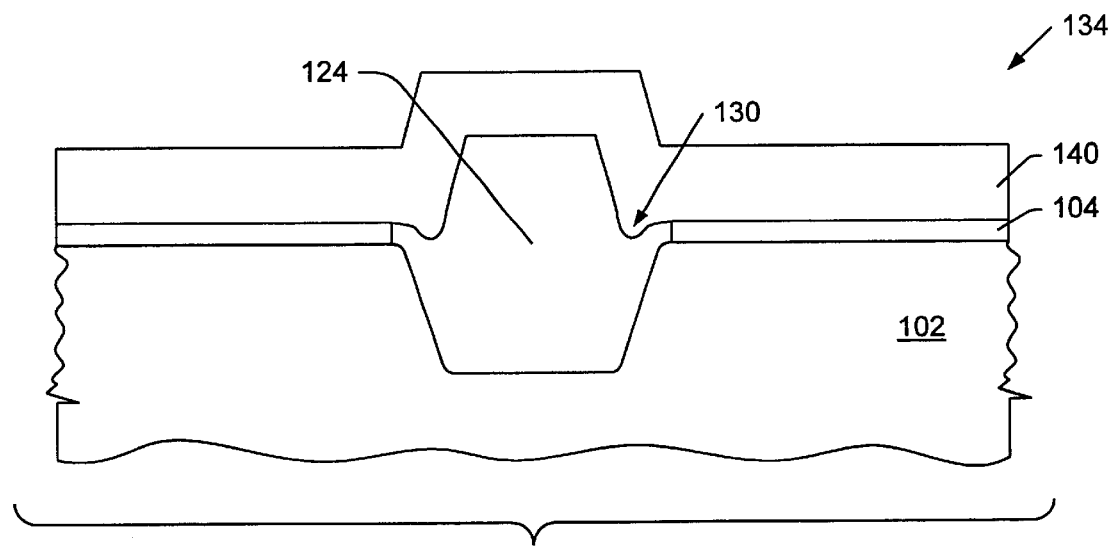

FIG. 3E shows a cross-sectional view of a semiconductor structure at 134 that results from performance of a step of depositing a silicon layer 140 over the exposed insulating layer 104, and over the remaining portion of the second insulating layer 124. In one embodiment, the silicon layer 140 is formed from polysilicon material. In another embodiment, the silicon layer 140 is formed from amorphous silicon material.

Figure 3F:
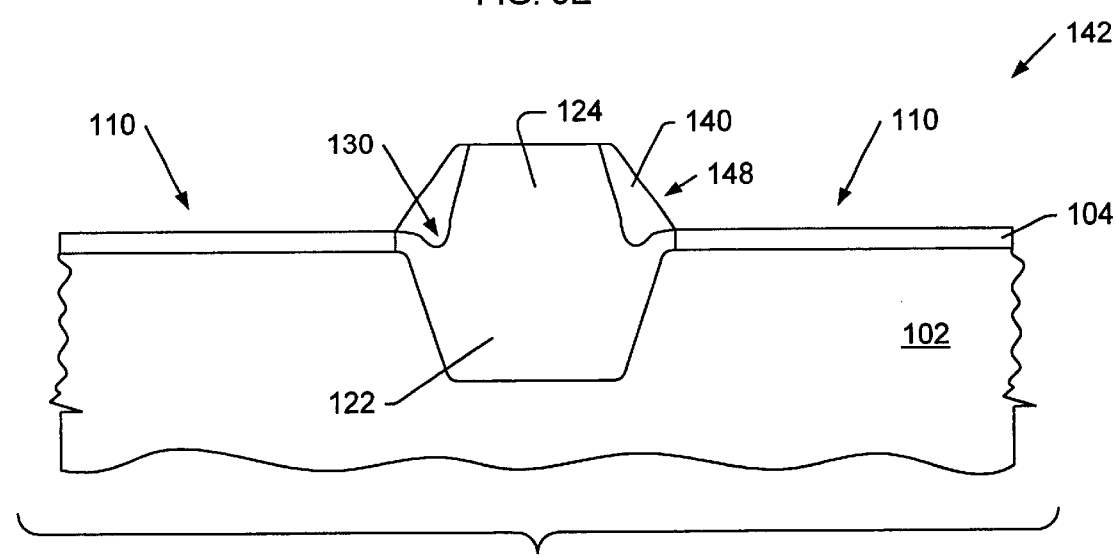

FIG. 3F shows a cross-sectional view of an STI structure at 142 formed in accordance with a first embodiment of a STI manufacturing process of the present invention. The STI structure 142 results from performing a dry etching step, and an oxidation step on the semiconductor structure 134 (FIG. 3E). The dry etching step is performed to remove a portion of the silicon layer 140 exposing the insulating layer 104 and a central portion of the second insulating layer 124, and leaving a portion 148 of the silicon layer 140 that fills the divot 130 proximate the edge of the trench 122. Note that the first insulating layer 104 provides an etch stop layer for protecting the substrate 102 during this etching step.

Subsequent to the etching step, an oxidation process is performed to oxidize the remaining portion 148 of the silicon layer 140 in order to form a silicon dioxide spacer filling the divot 130. In one embodiment, the oxidation step is a dry oxidation process performed in an environment wherein the temperature is controlled to be in an approximate range between 900 degrees Celsius and 1000 degrees Celsius. In another embodiment, the oxidation step is a wet oxidation process performed in an environment wherein the temperature is controlled to be in an approximate range between 900 degrees Celsius and 1000 degrees Celsius.

The STI structure 142, formed in accordance with the present invention as described above, provides isolation between active areas 110 of the substrate, thereby substantially reducing current leakage between the active areas 110 of the substrate. The divot 130 is effectively eliminated.

FIGS. 3G through 3J are cross-sectional views illustrating further manufacturing steps in accordance with an alternative embodiment of a process of manufacturing an STI structure according to the present invention. This alternative embodiment of the STI manufacturing process includes the steps described above with reference to FIGS. 3A through 3D, and further steps described in detail below with reference to FIGS. 3G through 3I.

Figure 3G:
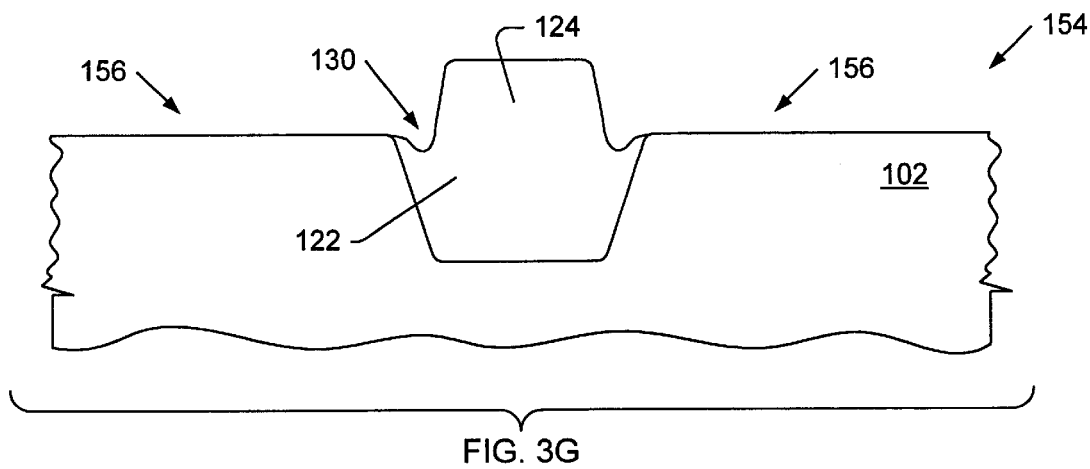

FIG. 3G shows a cross-sectional view of a semiconductor structure at 154 formed by removing the remaining portion of the first insulating layer 104 (FIG. 3D) of the semiconductor structure 128 (FIG. 3D). The remaining portion of the insulating layer 104 is removed to expose a portion 156 of the top surface of the substrate 102. Note that any STI oxide loss during the step of removing the first insulating layer 104 (pad oxide layer) is compensated for by depositing further oxide layers over the structure as further explained below. The further oxide layers may eliminate the divot, but cannot prevent STI oxide loss. Eventually, the further oxide layers must also be removed.

Figure 3H:
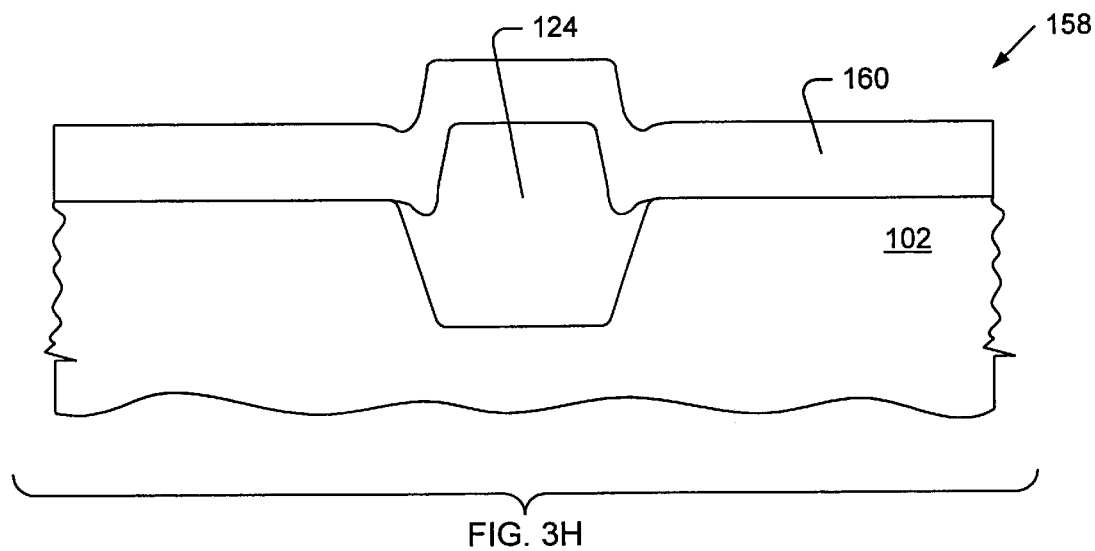

FIG. 3H shows a cross-sectional view of a semiconductor structure at 158 formed by depositing a screen oxide layer 160 over the exposed portion 156 of the substrate 102, and over the second insulating layer 124 in the trench area of the semiconductor structure 154 (FIG. 3G). The screen oxide layer 160 is deposited superjacent the exposed portion of the substrate 102, and over the second insulating layer 124 as well as the divot 130. The screen oxide layer 160 replaces the insulating layer 104 (FIG. 3D). The step of depositing the screen oxide layer 160 is preferably performed in accordance with a chemical vapor deposition (CVD) process. The CVD process may include low pressure chemical vapor deposition (LPCVD), plasma enhanced chemical vapor deposition (PECVD), or high density plasma CVD.

Figure 3I:
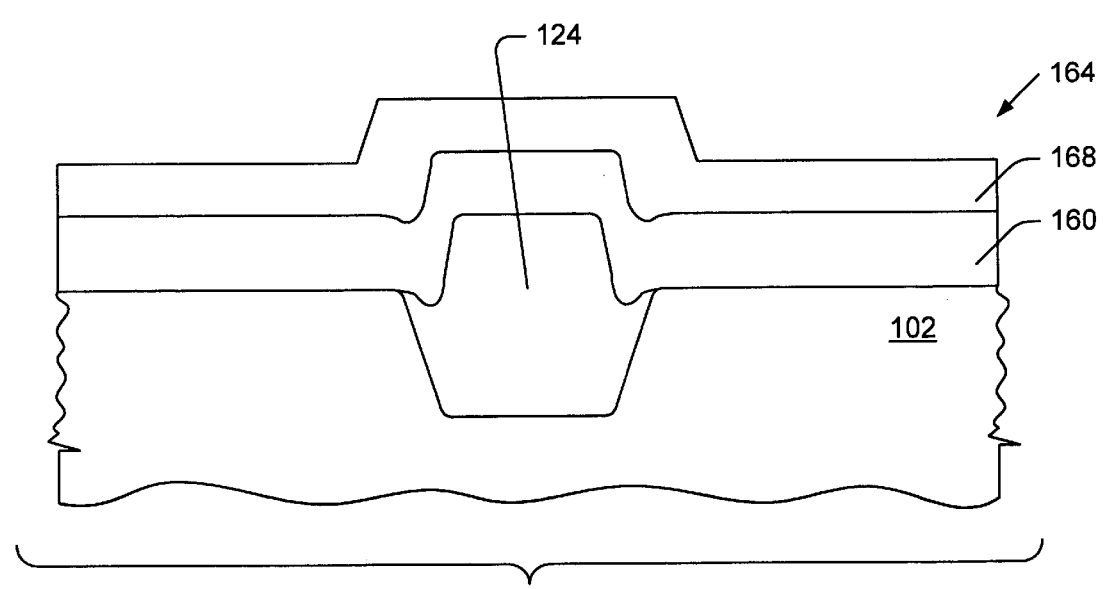

FIG. 3I shows a cross-sectional view of a semiconductor structure at 164 formed by depositing a silicon layer 168 over the screen oxide layer 160 of the semiconductor structure 158 (FIG. 3H). In one embodiment, the silicon layer 168 is formed from polysilicon material. In another embodiment, the silicon layer 168 is formed from amorphous silicon material.

Figure 3J:
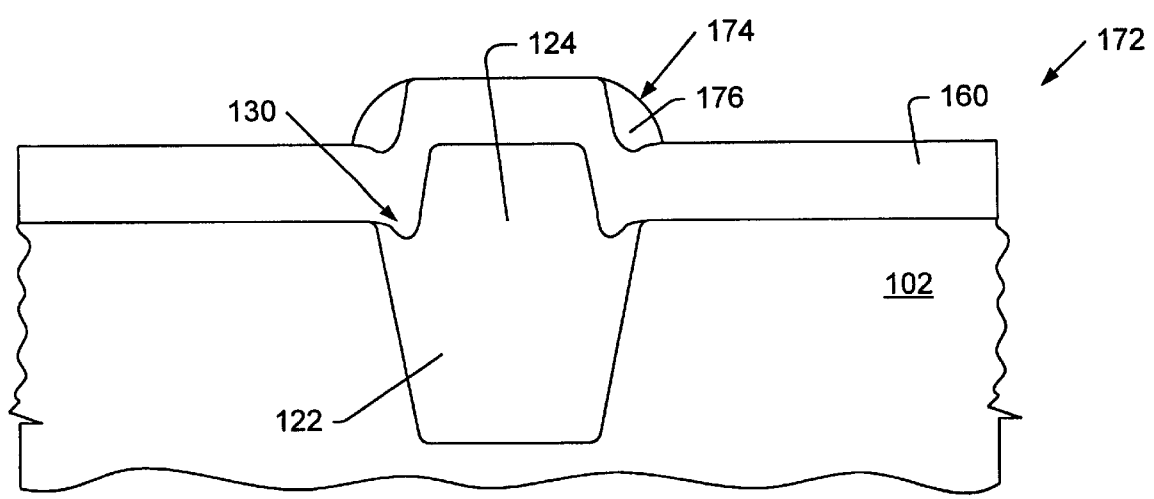

FIG. 3J shows a cross-sectional view of an STI structure at 172 in accordance with a second embodiment of the present invention, the STI structure 172 being formed by performing a dry etching step and oxidation step on the semiconductor structure 158 (FIG. 3H). The dry etching step is performed to remove a portion of the silicon layer 168 exposing the screen oxide layer 160 and a central portion of the screen oxide layer 160 disposed above the trench 122, and leaving a portion 174 of the layer 168 (FIG. 3I) above the divot 130 proximate the edge of the trench 122. Subsequently, an oxidation process is performed to oxidize the remaining portion 174 of the silicon layer 168 in order to form a silicon dioxide spacer 176. In one embodiment, the oxidation step is a dry oxidation process performed in an environment wherein the temperature is controlled to be in an approximate range between 900 degrees Celsius and 1000 degrees Celsius. In another embodiment, the oxidation step is a wet oxidation process performed in an environment wherein the temperature is controlled to be in an approximate range between 900 degrees Celsius and 1000 degrees Celsius. Note that the screen oxide layer 160 provides an etch stop layer during the step of removing the portion of the silicon layer 168. In accordance with the present invention, the divot 130 (FIG. 3G) is effectively eliminated as a result of the above described process.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A process of fabricating a shallow trench isolation structure comprising the steps of:
   providing a substrate;
   forming a first insulating layer over said substrate;
   forming a nitride masking layer over said first insulating layer;
   patterning and etching said nitride masking layer, said first insulating layer and said substrate to remove portions of said nitride masking layer, said first insulating layer and said substrate thereby forming an exposed trench in said substrate, said trench substantially defining boundaries of the isolation structure;
   depositing a second insulating layer into said trench and over said nitride masking layer;
   planarizing said second insulating layer to expose said nitride masking layer;
   removing said nitride masking layer to expose said first insulating layer, and forming a divot proximate an edge of said trench;
   depositing a silicon layer into said divot, and over said first insulating layer and said second insulating layer;
   etching said silicon layer to expose said first insulating layer, a central portion of said second insulating layer, and leaving a remaining portion of said silicon layer filling said divot; and
   oxidizing said remaining portion of said silicon layer.

2. A process of fabricating a shallow trench isolation structure as recited in claim 1 wherein said first insulating layer comprises a pad oxide layer.

3. A process of fabricating a shallow trench isolation structure as recited in claim 1 wherein said second insulating layer comprises silicon dioxide material.

4. A process of fabricating a shallow trench isolation structure as recited in claim 1 wherein said step of forming said nitride masking layer includes performing a chemical vapor deposition process.

5. A process of fabricating a shallow trench isolation structure as recited in claim 1 wherein said step of oxidizing said remaining portion of said silicon layer comprises performing a dry oxidation process.

6. A process of fabricating a shallow trench isolation structure as recited in claim 5 wherein said dry oxidation process is performed in an environment wherein temperature is controlled to be approximately below one thousand degrees Celsius.

7. A process of fabricating a shallow trench isolation structure as recited in claim 1 wherein said step of oxidizing said remaining portion of said silicon layer comprises performing a wet oxidation process.

8. A process of fabricating a shallow trench isolation structure as recited in claim 7 wherein said wet oxidation process is performed in an environment wherein temperature is controlled to be approximately below one thousand degrees Celsius.

9. A process of fabricating a shallow trench isolation structure as recited in claim 1 wherein said step of planarizing said second insulating layer comprises dry etching.

10. A process of fabricating a shallow trench isolation structure as recited in claim 1 wherein said step of planarizing said second insulating layer comprises chemical mechanical polishing.

11. A process of fabricating a shallow trench isolation structure comprising the steps of:
    providing a substrate;
    forming a first insulating layer over said substrate;
    forming a nitride masking layer over said first insulating layer;
    patterning and etching said nitride masking layer, said first insulating layer and said substrate to remove portions of said nitride masking layer, said first insulating layer and said substrate thereby forming an exposed trench in said substrate, said trench substantially defining boundaries of the isolation structure;
    depositing a second insulating layer into said trench and over said nitride masking layer;
    planarizing said second insulating layer to expose said nitride masking layer;
    removing said nitride masking layer to expose said first insulating layer, and forming a divot proximate an edge of said trench;
    removing said first insulating layer to expose a portion of said substrate;
    depositing a screen oxide layer over said second insulating layer and said exposed portion of said substrate, and filling said divot;
    depositing a silicon layer into said divot, and over said screen oxide layer;
    etching said silicon layer to exposed a portion of said screen oxide layer, and leaving a remaining portion of said silicon layer disposed over said screen oxide layer and substantially above said divot; and
    oxidizing said remaining portion of said silicon layer.

12. A process of fabricating a shallow trench isolation structure as recited in claim 11 wherein said first insulating layer comprises a pad oxide layer.

13. A process of fabricating a shallow trench isolation structure as recited in claim 11 wherein said second insulating layer comprises silicon dioxide.

14. A process of fabricating a shallow trench isolation structure as recited in claim 11 wherein said step of forming said nitride masking layer includes performing a chemical vapor deposition process.

15. A process of fabricating a shallow trench isolation, structure as recited in claim 11 wherein said step of oxidizing said remaining portion of said silicon layer comprises performing a dry oxidation process.

16. A process of fabricating a shallow trench isolation structure as recited in claim 15 wherein said dry oxidation process is performed in an environment wherein temperature is controlled to be approximately below one thousand degrees Celsius.

17. A process of fabricating a shallow trench isolation structure as recited in claim 11 wherein said step of oxidizing said remaining portion of said silicon layer comprises performing a wet oxidation process.

18. A process of fabricating a shallow trench isolation structure as recited in claim 17 wherein said wet oxidation process is performed in an environment wherein temperature is controlled to be approximately below one thousand degrees Celsius.

19. A process of fabricating a shallow trench isolation structure as recited in claim 11 wherein said step of planarizing said second insulating layer comprises dry etching.

20. A process of fabricating a shallow trench isolation structure as recited in claim 11 wherein said step of planarizing said second insulating layer comprises chemical mechanical polishing.

* * * * *